(12) United States Patent
Hung et al.

(10) Patent No.: US 12,185,644 B2
(45) Date of Patent: Dec. 31, 2024

(54) QUANTUM CIRCUIT WITH TRENCH CAPACITOR

(71) Applicant: International Business Machines Corporation, Armonk, NY (US)

(72) Inventors: Li-Wen Hung, Mahopac, NY (US); Elbert Emin Huang, Mountain View, CA (US); Harry Jonathon Mamin, Palo Alto, CA (US); Daniel Rugar, Los Altos, CA (US); Martin O. Sandberg, Ossining, NY (US); Joseph Finley, Rye Brook, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 438 days.

(21) Appl. No.: 17/563,441

(22) Filed: Dec. 28, 2021

(65) Prior Publication Data
US 2023/0210024 A1    Jun. 29, 2023

(51) Int. Cl.
| | |
|---|---|
| *H01L 23/48* | (2006.01) |
| *H01L 49/02* | (2006.01) |
| *H10N 60/01* | (2023.01) |
| *H10N 60/12* | (2023.01) |
| *H10N 69/00* | (2023.01) |

(52) U.S. Cl.
CPC .......... *H10N 69/00* (2023.02); *H01L 23/481* (2013.01); *H01L 28/90* (2013.01); *H10N 60/0912* (2023.02); *H10N 60/12* (2023.02)

(58) Field of Classification Search
CPC ............................. H10N 69/00; H10N 60/12
See application file for complete search history.

(56) References Cited

U.S. PATENT DOCUMENTS

| | | |
|---|---|---|
| 6,194,736 B1 | 2/2001 | Chaloux et al. |
| 10,068,184 B1 * | 9/2018 | Hertzberg .............. H10N 69/00 |
| 10,552,758 B2 | 2/2020 | Hertzberg et al. |
| (Continued) | | |

OTHER PUBLICATIONS

Gambetta et al., "Investigating Surface Loss Effects in Superconducting Transmon Qubits," IEEE Transactions on Applied Superconductivity, vol. 27, No. 1, Jan. 2017, 5 pages.

(Continued)

*Primary Examiner* — Samuel A Gebremariam
(74) *Attorney, Agent, or Firm* — Amin, Turocy & Watson, LLP

(57) ABSTRACT

One or more systems, devices, methods of use and/or methods of fabrication provided herein relate to a superconducting device that can be operated with minimal electric field energy coupling at surface layers of the superconducting device and/or that can have a small footprint. According to one embodiment, a device can comprise a Josephson junction located between a first capacitor portion and a second capacitor portion of a capacitor, wherein at least a trenched section of the first capacitor portion is located beneath a surface of a substrate, and wherein at least a trenched section of the second capacitor portion is located beneath the surface of the substrate. According to another embodiment, a device can comprise a capacitor disposed within a substrate layer and the capacitor comprising a pair of material-filled trenches in the substrate layer, and a Josephson junction coupled to the capacitor.

25 Claims, 12 Drawing Sheets

(56) References Cited

U.S. PATENT DOCUMENTS

| | | | |
|---|---|---|---|
| 10,672,971 | B2 | 6/2020 | Brink et al. |
| 10,686,007 | B2 | 6/2020 | George et al. |
| 10,833,121 | B2 | 11/2020 | Rosenblatt et al. |
| 10,916,690 | B2 | 2/2021 | Adiga et al. |
| 2018/0013052 | A1* | 1/2018 | Oliver .................. G06N 10/00 |
| 2020/0328338 | A1 | 10/2020 | Adiga et al. |
| 2021/0043823 | A1 | 2/2021 | Sadana et al. |

OTHER PUBLICATIONS

Hazard et al., "Abstract: E30.00001 : Superconducting qubits containing through-silicon vias*," APS March Meeting 2021—Event, http://meetings.aps.org/Meeting/MAR21/Session/E30.1, 1 page.

Mell et al., "The NIST Definition of Cloud Computing," Recommendations of the National Institute of Standards and Technology, NIST Special Publication 800-145, Sep. 2011, 7 pages.

* cited by examiner

QUANTUM CIRCUIT WITH TRENCH CAPACITOR

TECHNICAL FIELD

One or more embodiments described herein relate to a superconducting device and superconducting system that can be operated with minimal electric field energy coupling at surface layers of the superconducting device, and a corresponding method of fabrication and method of use. More particularly, the one or more embodiments described herein relate to a device and system having a superconducting capacitor for transmon qubit operation.

BACKGROUND

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, which can entangle multiple quantum bits and can use interference. Quantum computing has the potential to solve problems that, due to computational complexity, cannot be solved or can only be solved slowly on a classical computer.

SUMMARY

The following presents a summary to provide a basic understanding of one or more embodiments described herein. This summary is not intended to identify key or critical elements, or to delineate any scope of the particular embodiments and/or any scope of the claims. The sole purpose of the summary is to present concepts in a simplified form as a prelude to the more detailed description that is presented later. In one or more embodiments described herein, devices, systems, apparatuses, methods, computer-implemented methods and/or computer program products are described that can facilitate operating a qubit operated with minimal electric field energy coupling at surface layers of the superconducting device and/or that can have a small footprint.

According to an embodiment, a device can comprise a Josephson junction located between a first capacitor portion and a second capacitor portion of a capacitor, wherein at least a trenched section of the first capacitor portion is located beneath a surface of a substrate, and wherein at least a trenched section of the second capacitor portion is located beneath the surface of the substrate.

According to another embodiment, a method can comprise positioning, by a system operatively coupled to a processor, a Josephson junction between a first capacitor portion and a second capacitor portion of a capacitor, positioning, by the system, at least a trenched section of the first capacitor portion beneath a surface of a substrate, positioning, by the system, at least a trenched section of the second capacitor portion beneath the surface of the substrate.

An advantage of such devices and/or methods can be a superconducting device that has a reduced overall size and that can operate while producing a small electric field and as compared to existing technologies. The electric field can be majoratively directed and confined to a substrate of the device. That is, by employing parallel alignment of the paired metallic portions of the capacitor, combined with enclosing trenched sections of the capacitor within the substrate layer, one or more of these advantages can be realized. Indeed, as a result of one or more of these advantages, operation of the device in a quantum system can lead to reduced noise and/or improved coherence of one or more qubits. Furthermore, the reduced overall size of the device can allow for increased quantity of such devices to be employed relative to a common overall footprint, such as within a cryogenic chamber.

In one or more embodiments of the above devices and/or methods, for at least one of the trenched sections, a depth into the substrate of a trench having the trenched section disposed therein can be greater than a widest gap width between the trenches/trenched sections at the substrate. An advantage of such device and/or method can be direction and confinement of an electric field produced to the substrate. This can be realized at least in part due to the trenching of the trenched sections and determined dimensioning.

In one or more embodiments of the above devices and/or methods, the trenches can each further comprise a fill material filling a remainder of the trench. An advantage of such device and/or method can be structural support of the superconducting surface sections enclosing the respective trenches. Another advantage can be to facilitate fabrication of such device employing patterning approaches, such as photoligthography, relative to one or more surfaces of a substrate having minimal topography.

According to yet another embodiment, a trench capacitor comprising a pair of trenched sections spaced apart from one another within a common substrate layer, and a pair of superconducting pad sections enclosing the trenched sections within the substrate layer, and a Josephson junction coupled to the trench capacitor.

According to a further embodiment, a method can comprise exciting, by a system operatively coupled to a processor, a trench capacitor comprising a pair of trenched sections disposed within a common substrate layer, the trenched sections enclosed within the substrate layer by separate superconducting pad sections, and concurrently exciting, by the system, a Josephson junction coupled to the trench capacitor.

An advantage of such devices and/or methods can be a superconducting device that has a reduced overall size and that can operate while producing a small electric field and as compared to existing technologies. The electric field can be majoratively directed and confined to a substrate layer of the device, such as to a bulk of the substrate layer with minimal and/or no confinement to an external surface(s) of the substrate layer. That is, by employing parallel alignment of the paired metallic portions of the capacitor, combined with enclosing of trenched sections of the capacitor within the substrate layer, one or more of these advantages can be realized. Indeed, as a result of one or more of these advantages, operation of the device in a quantum system can lead to reduced noise and/or improved coherence of one or more qubits. Furthermore, the reduced overall size of the device can allow for increased quantity of such devices to be employed relative to a common overall footprint, such as within a cryogenic chamber.

According to still another embodiment, a device can comprise a capacitor disposed within a substrate layer and the capacitor comprising a pair of material-filled trenches in the substrate layer, and a Josephson junction coupled to the capacitor.

An advantage of such device can be a superconducting device that has a reduced overall size and that can operate while producing a small electric field, as compared to existing technologies. The electric field can be majoratively directed and confined to a substrate layer of the device, such as to a bulk of the substrate layer with minimal and/or no confinement to an external surface(s) of the substrate layer. That is, by employing parallel alignment of the paired metallic portions of the capacitor, combined with enclosing within the substrate layer one or more sections of the capacitor, one or more of these advantages can be realized. Indeed, as a result of one or more of these advantages, operation of the device in a quantum system can lead to reduced noise and/or improved coherence of one or more qubits. Furthermore, the reduced overall size of the device can allow for increased quantity of such devices to be employed relative to a common overall footprint, such as within a cryogenic chamber. An advantage of material fill can be structural support of superconducting pad sections of the capacitor enclosing the respective trenched sections of the capacitor. Another advantage can be to facilitate fabrication of such device employing patterning approaches, such as photoligthography, relative to one or more surfaces of a substrate having minimal topography.

DETAILED DESCRIPTION

Figure 1:
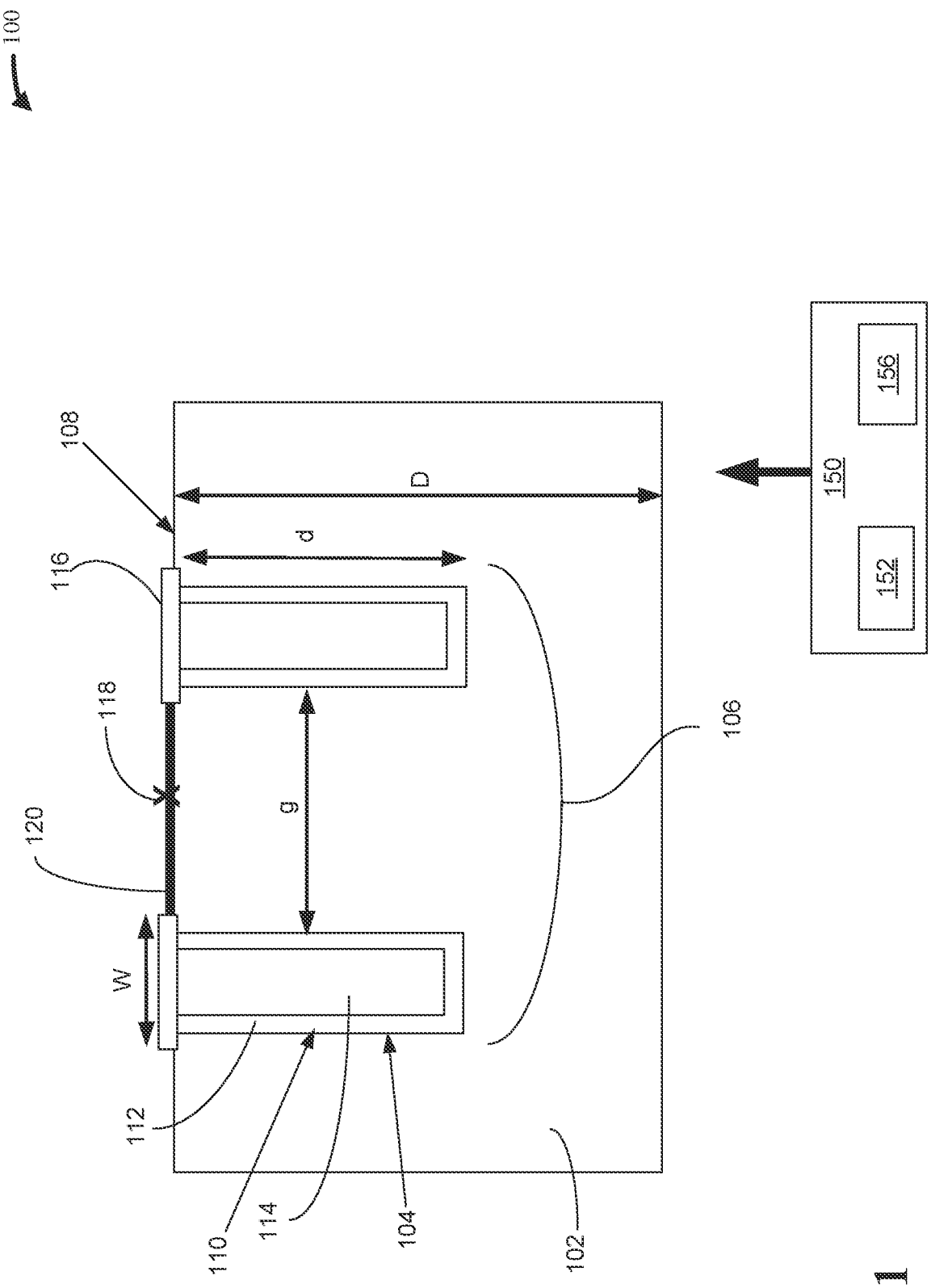
FIG. 1 illustrates a cross-section of a device, in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in this Detailed Description section.

On a large scale, quantum computing cloud service providers can execute millions of quantum jobs for users during a year. Each quantum job can include the execution of one or more quantum programs. Where feasible, one or more quantum programs can operate on one or more same qubits. Where qubit states only can exist (or can only be coherent) for a limited amount of time, an objective of operation of a quantum logic circuit (e.g., including one or more qubits) can be to reduce the time of the operation and/or increase the speed of the operation. Time spent to operate the quantum logic circuit can undesirably reduce the available time of operation on one or more qubits. This can be due to the available coherence time of the one or more qubits prior to decoherence of the one or more qubits. For example, a qubit state can be lost in less than 100 to 200 microseconds in one or more cases. Further, operations on qubits generally introduce some error, such as some level of decoherence and/or some level of quantum noise, further affecting qubit availability. Quantum noise can refer to noise attributable to the discrete and/or probabilistic natures of quantum interactions. Device designs that prolong the lifetime of the quantum state and extend the coherence time can be desirable.

Also on the large scale, a large quantity of quantum jobs can create pressure to execute the respective quantum programs quickly. That is, increased speed of execution can directly and/or indirectly correlate to maximizing system usage, minimizing users having to wait for measurement results, and/or minimizing undesirable consuming of classical computational resources. Pressure also can be created to execute these quantum jobs well, so that a most performance can be extracted from near-term error-prone systems and/or so that a quality of compiling into physical-level pulses can be improved (e.g., related to accuracy, precision and/or efficiency of pulse execution).

Physical, real-world, quantum logic circuits controlled by a quantum system can include a plurality of qubits. One type of qubit, a superconducting qubit can include a Josephson junction, and operates generally only within a cryogenic chamber. A transmon qubit is a particular type of a superconducting qubit that can comprise one or more shunt capacitors to reduce charge noise that can affect the performance of the transmon qubit. Shunt capacitors are a part of the transmon qubit that is electrically connected to the Josephson junction.

A Josephson junction can be formed by separating two thin-film superconducting metal layers by a non-superconducting material. When the metal in the superconducting layers is caused to become superconducting, e.g., by reducing the temperature of the metal to a specified cryogenic temperature, one or more pairs of electrons can tunnel from one superconducting layer through the non-superconducting layer to the other superconducting layer. In a superconducting qubit, the Josephson junction, which has a generally finite inductance, can be electrically coupled in parallel with one or more capacitive devices, such as forming a nonlinear resonator.

Information processed by qubits can be emitted in the form of microwave energy in a range of microwave frequencies. The microwave emissions can be captured, processed, and analyzed to decipher the quantum information encoded therein. For quantum computing of qubits to be reliable, quantum circuits, e.g., the qubits themselves, the readout circuitry associated with the qubits, and/or other types of superconducting quantum logic circuits, should not alter the energy states of the particles or the microwave emissions, and thus not create noise and/or decoherence of qubits. This operational constraint on any circuit that operates with quantum information thus calls for special considerations in fabricating structures, such as superconducting structures, that are used in such a circuit.

Accordingly, while an ideal capacitor that is used in a superconducting quantum logic circuit, and particularly in a qubit, e.g., in conjunction with a Josephson junction, should be fabricated and/or operated according to this operational constraint, existing actual capacitors, and thus existing actual qubits, can operate other than ideally, and thus other than according to this operational constraint. Limitation relative to this operational constraint can result in undesired noise and or qubit decoherences, and thus less efficient, slow, and more costly execution of quantum jobs.

Further existing capacitor structures employed in qubits are significantly larger in size than a size of the Josephson junction(s) employed in combination with the existing capacitor structure. The large size of the capacitor can limit a number of qubits and/or other quantum readout circuitry that can be fabricated per die in a fabrication process, and/or that can fit in a cryogenic chamber and/or be efficiently operated together. These limitations can limit and/or prevent construction of quantum systems employing large numbers of qubits, and particularly superconducting qubits.

In view of the aforementioned one or more problems with current approaches and or devices employed in quantum systems, and particularly relative to physical qubits, it can be desired to improve upon size reduction and/or electric field control within such devices. To that end, the described subject matter can employ various techniques that can improve (e.g., enhance, optimize and/or reduce) the execution time for executing quantum jobs and/or improve (e.g., enhance, optimize and/or increase) the quality of execution of such quantum jobs. In one or more cases, the one or more embodiments described herein can allow for increased scaling of execution of the associated quantum programs implementing quantum circuits, such as due to increased scaling (e.g., plural numbers of device) of the devices employed.

A superconducting device as described herein, in the one or more embodiments below, can employ parallel capacitor section alignment within a substrate layer, such as a silicon substrate layer. In addition the device can employ trenching within the substrate layer and/or trench enclosing (e.g., via substrate and capacitor sections) to reduce the electric field participation of the substrate to air interface at the superconducting device. In one or more embodiments, a material fill can be employed to generally fully fill such trenches.

One or more of these features, can allow for better direction and/or confinement of electrical field produced by the device, as compared to existing techniques, thus leading to uniform intensity distribution of the electrical field, such as within the substrate layer as opposed to at an external surface of the substrate layer. That is, at an external surface, one or more undesirable layers can be formed. These one or more undesirable layers can form over time, can be disordered, can be contaminated and/or comprise contaminants, and/or can comprise undesired oxidized material. The one or more embodiments described herein can counter this effect by reducing the substrate to air interface, thus reducing noise produced by or during use of the one or more embodiments, as compared to existing techniques. Further, coherence of a qubit device employing a superconducting device of the one or more embodiments described herein can be improved, such as prolonged, as compared to existing techniques.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. It is evident, however, in various cases, that the one or more embodiments can be practiced without these specific details.

The embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems, devices and/or methods described herein, such as device 100 as illustrated at FIG. 1, and/or systems employing the device 100, can further comprise one or more computer and/or computing-based elements described herein with reference to an operating environment, such as the operating environment 1000 illustrated at FIG. 10. In one or more described embodiments, computer and/or computing-based elements can be used in connection with implementing one or more of the systems, devices, components and/or computer-implemented operations shown and/or described in connection with FIG. 1 and/or with other figures described herein.

Generally, the device 100, a superconducting device 100, can comprise a capacitor having a pair of capacitor portions. Each capacitor portion can comprise trenched sections (e.g., within a substrate) and surface sections (e.g., at a surface of the substrate). Superconducting pads at (e.g., on or adjacent to with another one or more layers in between) the substrate can be and/or be comprised by the surface sections. The superconducting pads can cover and/or enclose the corresponding trenched sections within the substrate, and a Josephson junction can be located between the superconducting pads. Put another way, the device 200 can comprise a trench capacitor comprising a pair of trenches spaced apart from one another within a common substrate layer, wherein the trenches are enclosed at the substrate layer by separate superconducting pads, and a Josephson junction is located between the superconducting pads. Put still another way, the device 200 can comprise a capacitor disposed within a substrate layer and the capacitor comprising a pair of material-filled trenches in the substrate layer, and a Josephson junction coupled to the capacitor.

As illustrated, the device 100 can comprise a substrate layer 102 and two or more trenched sections 104 of a capacitor 106. The substrate layer 102 can comprise any suitable material, such as silicon. One or more additional materials can be included in one or more embodiments. The silicon substrate layer 102 can have dimensions suitable to at least partially surround, such as to fully surround, the two or more trenched sections 104. Surrounding the trenched sections 104 more fully and/or fully can reduce and/or eliminate substrate to air participation of the trenched sections 104 relative to an electric field produced. In the illustrated embodiment, the dimension D can be in a range between and inclusive of about 200 µm and about 800 µm, in a range between and inclusive of about 250 µm and about 300 µm, such as about 275 µm, and/or in a range between and inclusive of about 250 µm and about 750 µm, such as about 730 µm.

The substrate layer 102 can serve as a dielectric for trenched sections 104 comprised by the capacitor 106. The trenched sections 104 generally extend parallel to one another within the substrate 102, such as being vertically aligned relative to the orientation of the external surface 108 at FIG. 1. In use, in one embodiment, the device can be oriented such that the capacitor 106 comprises the trenched sections 104 vertically aligned with the substrate layer of a respective chip of a qubit. In the illustrated embodiment, the trenched sections 104 are generally transversely aligned, such as orthogonally aligned, relative to an external surface 108 of the substrate layer 102. In one or more other embodiments, the trenched sections 104 can be differently aligned relative to the external surface 108 of the substrate layer 102, than what is illustrated at FIG. 1.

As compared to existing parallel plate capacitors, the aforementioned construction of the capacitor 106 can account for one or more deficiencies, such as existing coplanar plate capacitors having electrical charge built up at edges of the respective capacitor plates. Indeed, a parallel plate capacitor, as generally embodied by the capacitor 106, can provide a uniform charge and field distribution about the respective capacitor plates, such can lead to a lower peak field value relative to voltage across respective superconducting pads. Fabrication of such device also can be facilitated employing patterning approaches, such as photoligthography, relative to one or more surfaces of a substrate having minimal topography.

The trenched sections 104 can be contained within trenches 110 formed into the substrate layer 102. Within the respective substrate layer 102, the trenches 110 can have depths d, for example, in a range between and inclusive of about 40 µm and about 250 µm, in a range between and inclusive of about 50 µm and about 100 µm, in a range between and inclusive of about 40 µm and about 60 µm and/or in a range between and inclusive of about 80 µm and about 120 µm, such as about 50 µm or about 100 µm.

As illustrated, for at least one of the trenched sections 104, such as for both of the trenched sections 104, the depth d into the substrate layer 102 of the respective trench 110 can be greater than a greatest width w of the same trench 110 at a surface of the substrate layer 102, such as the surface 108. At the respective substrate layer 102, the trenches 110 can have widths w, for example, in a range between and inclusive of about 1 µm and about 20 µm, in a range between and inclusive of about 2 µm and about 10 µm, in a range between about 5 µm and about 9 µm and/or in a range between and inclusive of about 4 µm and about 8 µm, such as about 1 µm or about 4 µm.

A trenched section 104, and particularly each trenched section 104 can include one or more walls of the respective trench 110 lined with a material, such as a metal material. As illustrated, in one or more embodiments, each wall of the respective trenches 110 can be lined with a metal layer 112, such as the same metal layer 112 lining each of the walls of a respective trench 110. The metal layer can be a superconducting liner such as TiN, TaN, Ta, Ti W, Nb, Al, NbN and/or other suitable superconductor. In one or more other embodiments, one or more other metals, such as superconducting metals can be employed. The metal layer 112 can be deposited by physical vapor deposition, chemical vapor deposition, atomic layer deposition, plasma-enhanced atomic layer deposition and/or other suitable method of material deposition.

In one or more embodiments, one or more metal layers 112 can be employed that line all and/or less than all of the walls of a respective trench. Different metal layers can comprise one or more different materials, such as metals, such as superconducting metals.

In one or more embodiments, a material fill 114 can fill at least part of, such as a remainder of (e.g., accounting for imperfections, air pockets, etc.) at least one of the trenches 210, such as both trenches 110. That is, the material fill 114 can be at least partially bounded by the walls of the respective metal layer 112. In one or more embodiments, the material fill 114 can be solid, liquid, slurry and/or a combination thereof. The material fill 114 can comprise vacuum, air, metal, semiconductor and/or insulator. The material fill 114 can comprise one or more of germanium, polycrystalline silicon (poly-Si), amorphous carbon, silicon dioxide, silicon nitride, silicon-germanium, SiCOH, indium, copper, tin and/or gold.

Furthermore, the device 100 can comprise at least one of, such as both of, the trenched sections 104, and thus the trenches 110 can be at least partially defined within the substrate layer 102. Indeed, providing such partial enclosing within the substrate layer 102 can reduce and/or eliminate substrate to air participation of the trenched sections 104. Separate superconducting pads 116 (e.g., surface sections of the capacitor 106) can be employed for at least partially enclosing the trenches 110 at the substrate layer 102. The superconducting pads 116, such as plates, can have any suitable dimensions for fully enclosing, e.g., covering, respective heads of the trenched sections 104 at an external surface of the substrate layer 102. That is, the superconducting pads 116 can be disposed at a common external surface, such as the surface 108, of the substrate layer 102. In one or more embodiments, the material of the superconducting pads 116 can include a material, such as a metal, that is not comprised by the metal layers 112, and/or vice versa. In one or more embodiments, the superconducting pads 116 can be comprised of a superconducting metal, such TiN, TaN, Ta, Ti, W, Nb, Al, V, or NbN.

In one or more embodiments, the material fill 114 can be omitted for at least one of the trenched sections 104, such as for both of the trenched sections 104. For example, a gas fill can be utilized or a gas and solid material can be utilized. In one or more embodiments, one or both of the sections defined by the material fill 114 at FIG. 1 can be empty, such as being vacuum chambers. That is, the superconducting pads 116 can be constructed, such as having sufficient strength, to be supported by the substrate layer 102 absent a solid or liquid material fill 114.

As illustrated, a Josephson junction 118 can be disposed, such as located, between the superconducting pads 116 trenched sections 104. In one embodiment, the Josephson junction 118 can be disposed, such as located, at a surface of the substrate layer 102, such as the surface 108. In one embodiment, the Josephson junction 118 can be at least partially embedded into the surface 108. The Josephson junction 118 can be coupled to the pair of trenched sections 104 by any suitable means, such as being coupled to the opposing superconducting pads 116, which then can be coupled to the trenched sections 104.

In one or more embodiments, couplers 120 can connect the Josephson junction 118 to the superconducting pads 116. Any suitable material can be employed for the couplers 120, such as wire, plating or other electrically-suitable connection, such as including vapor deposited aluminum and/or niobium.

The Josephson junction 118 generally can be located at the surface 108 above the gap g between the trenched sections 104. In one embodiment, the Josephson junction 118 can be at least partially located along the depth d of the trenches 110, within the gap g, directly between the trenched sections 104. In one or more other embodiments, the Josephson junction 118 can be located elsewhere relative to the substrate layer 102, but coupled to the trenched sections 104, such as by the superconducting pads 116.

Within the respective substrate layer 102, the trenches 110 can have a gap g therebetween, for example, in a range between and inclusive of about 20 µm and about 65 µm, in a range between and inclusive of about 20 µm and about 40 µm, in a range between and inclusive of about 30 µm and about 50 µm and/or in a range between and inclusive of about 50 µm and about 70 µm, such as about 25 µm, about 40 µm or about 60 µm. In one or more other embodiments, the trenches 110 can have a gap g therebetween, for example in a range between and inclusive of about 5 µm to about 80 µm, in a range between and inclusive of about 5 µm to about 10 µm, and/or in a range between and inclusive of about 25 µm and about 80 µm, such as about 5 µm, about 10 µm, about 40 µm, about 60 µm or about 80 µm.

In an embodiment, a depth d of about 100 µm can be employed relative to a gap g of about 25 µm, about 40 µm or about 60 µm for a trench 110. In an embodiment, both trenches 110 can have these same and/or similar dimensions. In another embodiment, a depth d of about 50 µm can be combined relative to a gap g of about 25 µm or about 40 µm for a trench 110. In an embodiment, both trenches 110 can have these same and/or similar dimensions. In one or more embodiments, a ratio of depth to gap (e.g., d/g) can be greater than or equal to about 1.

In one or more embodiments, one or more operations for constructing the one or more alignments, arrangements, rows, connections, couplings, orientations, and/or the like can be performed by a manufacturing system, such as a manufacturing system 150 comprising one or more manufacturing devices 152, where the manufacturing system 150 can be operatively coupled to a processor 156 for at least partially controlling the one or more operations. The processor 156 can be any suitable processor. Discussion proved below with respect to processor 1006 can be at least partially equally applicable to the processor 156.

In one or more embodiments, the manufacturing system 150 can be configured, such as via one or more operations performed by one or more of the manufacturing devices 152 in view of one or more instructions provided by the processor 156, to construct the device 100. The manufactured device 100 can be included in a quantum logic circuit for being operated on as part of a quantum system and/or for being controlled by a suitable quantum processor.

Turning next to FIGS. 2 to 7, these figures illustrate a plurality of variations of the device 100. The devices 200, 300, 400, 500, 600 and 700 comprise many of the same features of the device 100 and each provides the advantages of the device 100, as compared to existing devices and/or techniques. Furthermore, the devices 200, 300, 400, 500, 600 and 700 can provide additional advantages as described below.

Figure 2:
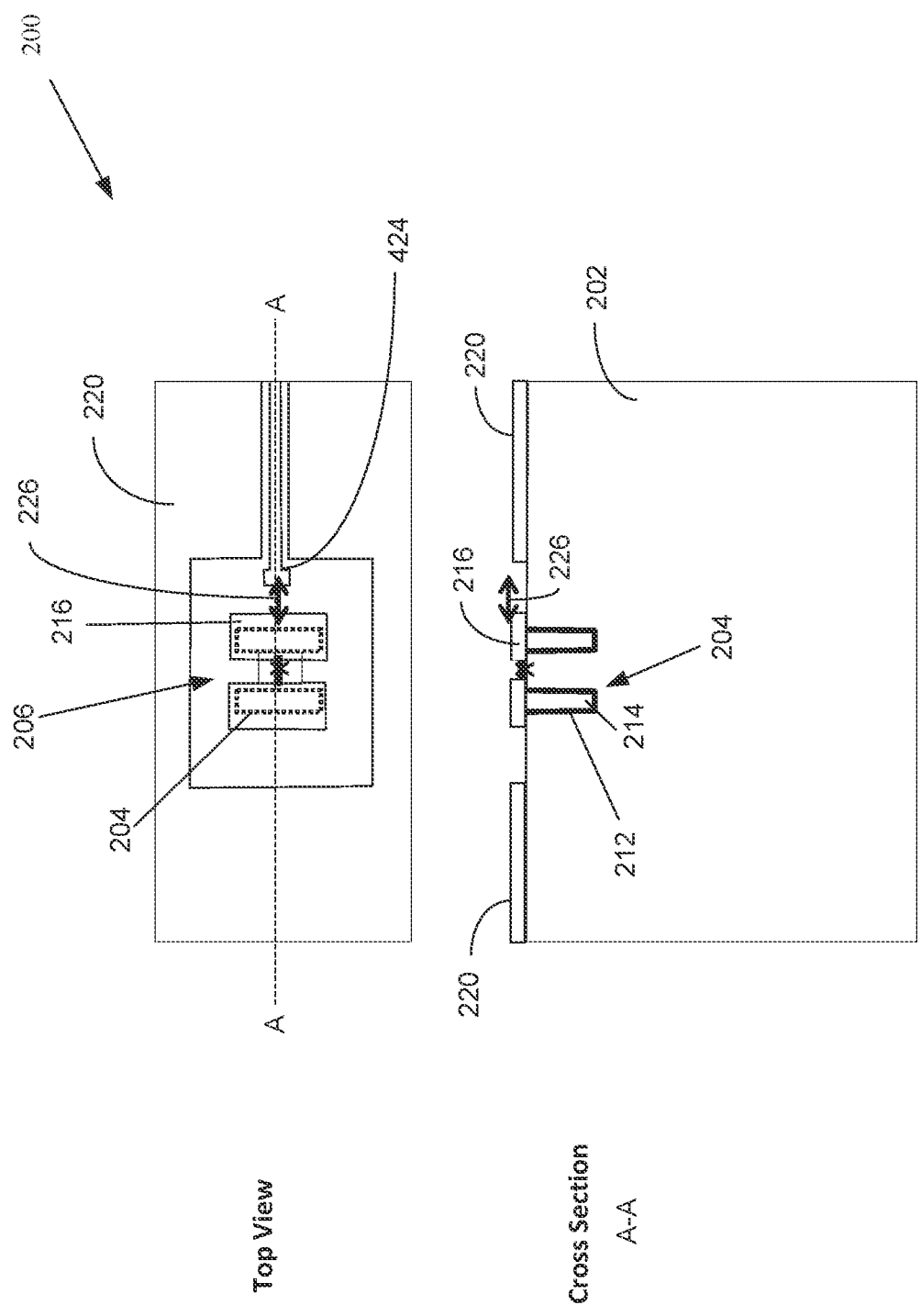
FIG. 2 illustrates a set of diagrams of various views of a device constructed in accordance with one or more embodiments described herein.

At FIG. 2, a device 200 has a ground layer 220 disposed at a side of the substrate layer 202 at which the superconducting pads 216 are located. The ground layer 220 is spaced from the trench capacitor 206. The ground layer 220 can be comprised of any suitable superconducting metal, such as Nb, TiN, TaN, Ta, Ti, W, Nb, Al, V and/or NbN. That is, the ground layer 220 can have a shape with a portion omitted at a location of the trench capacitor 206. A resonator 224, such as a coplanar-waveguide resonator, can extend along the ground layer 220 and/or at least partially within the substrate layer 202 to a position adjacent the trench capacitor 206. The resonator 224, and indeed any resonator described above and/or below herein, can be employed for drive and/or readout. A coupling 226 can be provided to couple the trench capacitor 206 to the resonator 224. Although only a single coplanar waveguide is illustrated at FIG. 2, a qubit (e.g., qubit device) can be coupled to plural coplanar waveguides in one or more other embodiments, such as to facilitate coupling between qubits (e.g., qubit devices).

Figure 3:
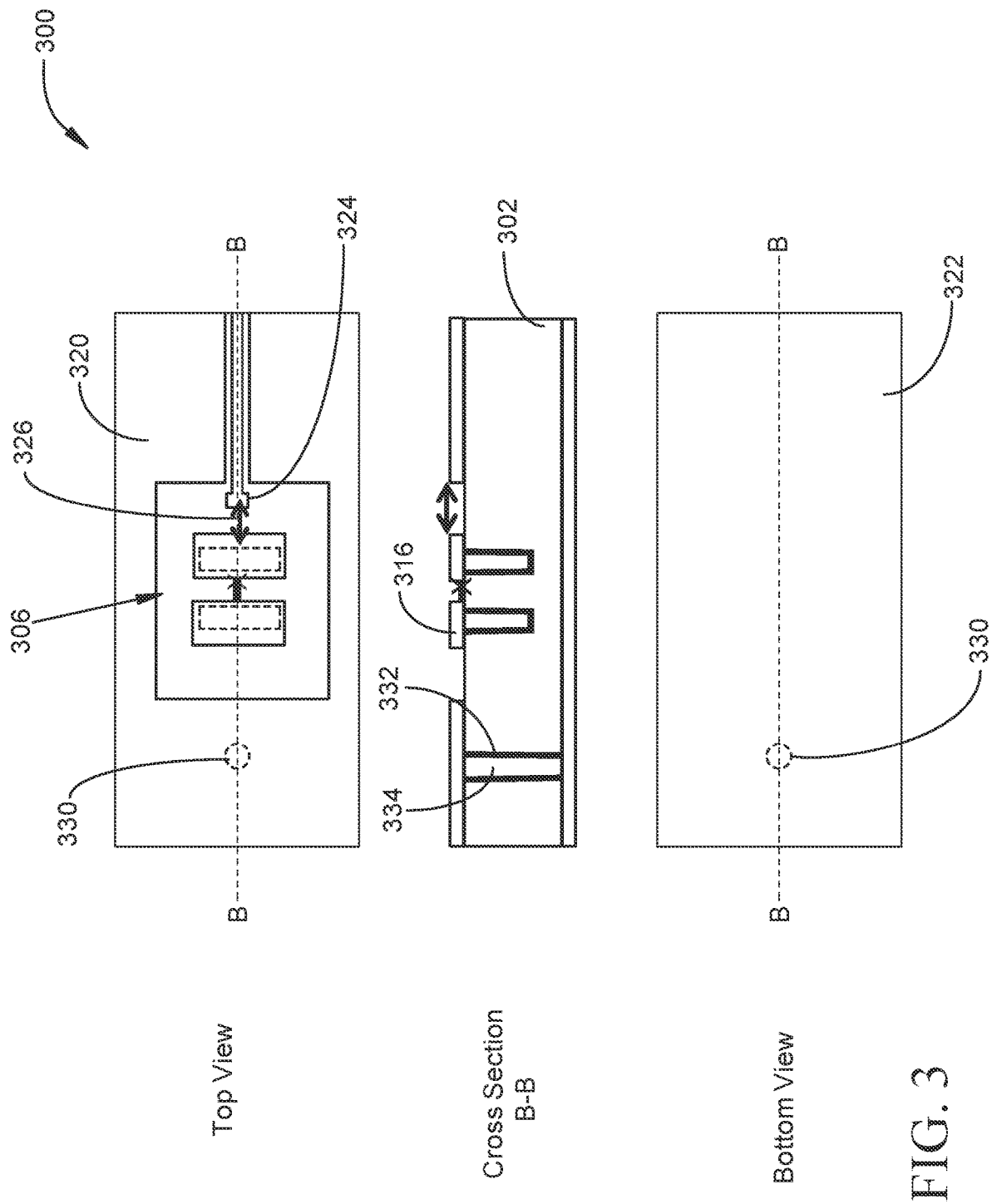
FIG. 3 illustrates a set of diagrams of various views of another device constructed in accordance with one or more embodiments described herein.

At FIG. 3, a device 300 has a ground layer 320 disposed at a side of the substrate layer 302 at which the superconducting pads 316 are located. The ground layer 320 is spaced from the trench capacitor 306. The ground layer 320 can have a shape with a portion omitted at a location of the trench capacitor 306. Another ground layer 322 can be disposed opposing the ground layer 320, at a side of the substrate layer 302 opposite the ground layer 320. The ground layers 320 and 322 can be comprised of any suitable metal, such as Nb. A resonator 324, such as a coplanar waveguide resonator, can extend along the ground layer 320 and/or at least partially within the substrate layer 302 to a position adjacent the trench capacitor 306. A coupling 326 can be provided to couple the trench capacitor 306 to the resonator 324. A through substrate via (TSV) 330 can extend fully through the substrate layer 302, connecting the ground layers 320 and 322. The TSV 330 can be retained within a trench extending between two sides of the substrate layer 302. The TSV 330 can comprise the same or different materials as the trench capacitor 306 comprises for the metal layer 332 and material fill 334. Although only a single coplanar waveguide is illustrated at FIG. 3, a qubit (e.g., qubit device) can be coupled to plural coplanar waveguides in one or more other embodiments, such as to facilitate coupling between qubits (e.g., qubit devices).

Figure 4:
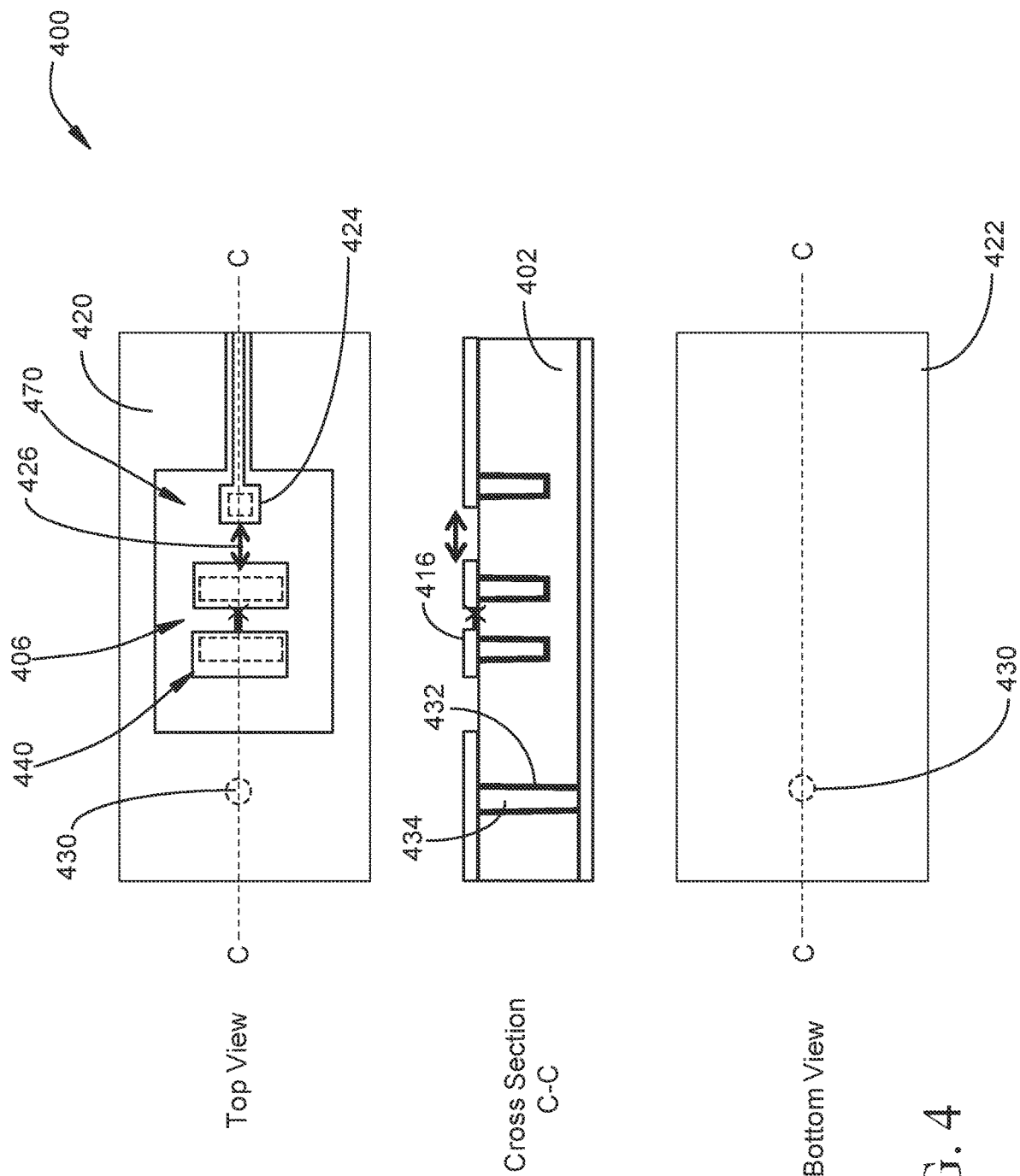
FIG. 4 illustrates a set of diagrams of various views of still another device constructed in accordance with one or more embodiments described herein.

At FIG. 4, a device 400 has a ground layer 420 disposed at a side of the substrate layer 402 at which the superconducting pads 416 are located. The ground layer 420 is spaced from the trench capacitor 406. The ground layer 420 can have a shape with a portion omitted at a location of the trench capacitor 504. Another ground layer 422 can be disposed opposing the ground layer 420, at a side of the substrate layer 402 opposite the ground layer 420. The ground layers 420 and 422 can be comprised of any suitable metal, such as Nb. A resonator 424, such as a coplanar waveguide resonator, can extend along the ground layer 420 and/or at least partially within the substrate layer 402 to a position adjacent the trench capacitor 406. A coupling 426 can be provided to couple the trench capacitor 406 to the resonator 424. A through substrate via (TSV) 430 can extend fully through the substrate layer 402, connecting the ground layers 420 and 422. The TSV 430 is retained within a trench extending between two sides of the substrate layer 402. The TSV 430 can comprise the same or different materials as the trench capacitor 406 comprises for the metal layer 432 and material fill 434. Although only a single coplanar waveguide is illustrated at FIG. 4, a qubit (e.g., qubit device) can be coupled to plural coplanar waveguides in one or more other embodiments, such as to facilitate coupling between qubits (e.g., qubit devices).

Further, the resonator 424 is trenched. Compared with a resonator without a trenched coupler, in view of the trenched resonator 424, less electric field can be at the substrate surface 470 and more electric field can exist in a bulk of the substrate layer 402.

Figure 5:
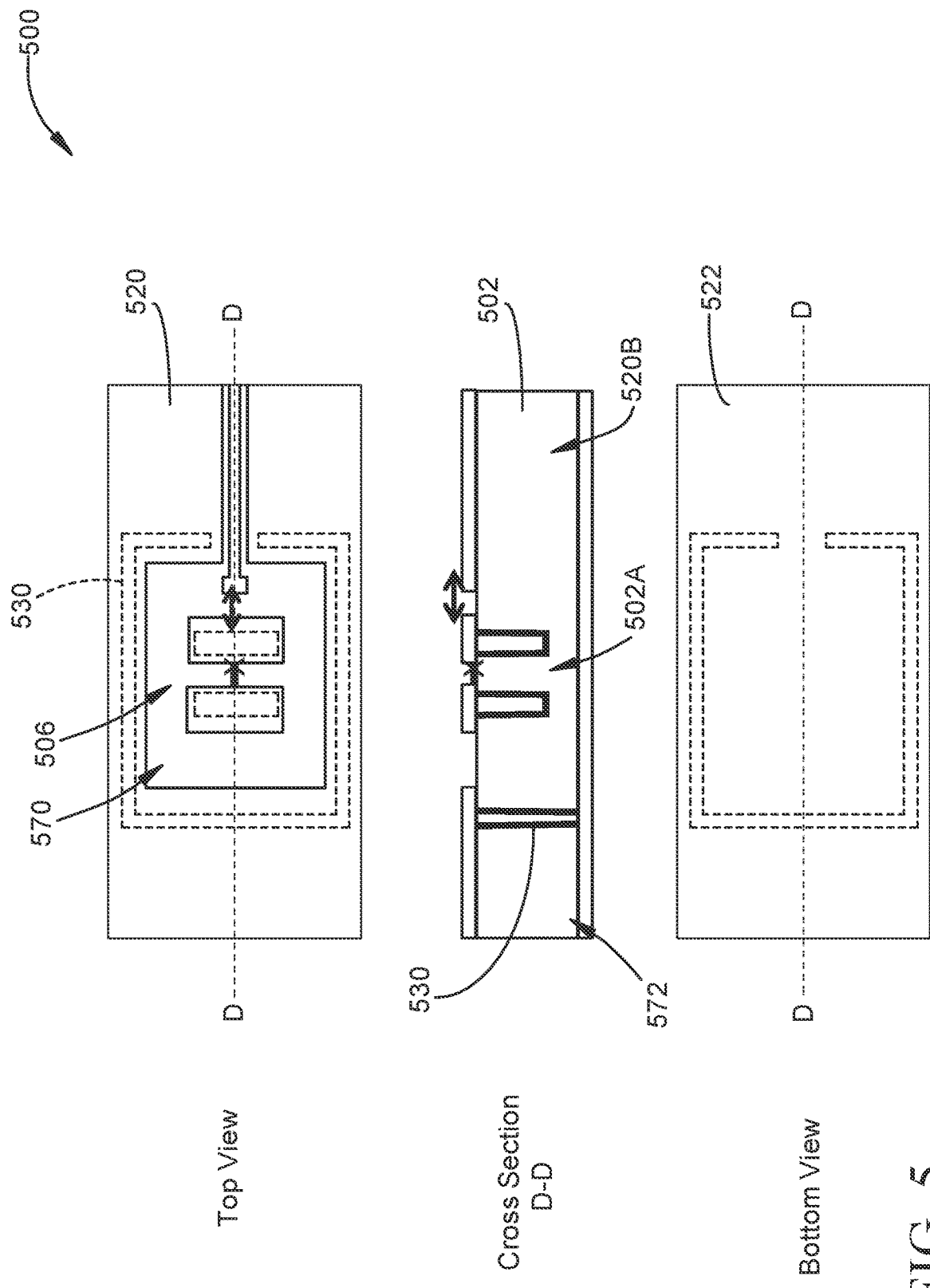
FIG. 5 illustrates a set of diagrams of various views of yet another device constructed in accordance with one or more embodiments described herein.

At FIG. 5, a device 500 is substantially similar to the device 300 of FIG. 3. Different from the device 300, the device 500 comprises a TSV 530 that is constructed and/or acts as a shield circumscribing and/or bounding the trench capacitor 506 within the substrate layer 502. The "shield" TSV 530 can reduce radiated power which can otherwise shorten coherence time of the respective qubit device 500, and/or the "shield" TSV 530 can reduce cross-talk between the qubit device 500 and one or more qubit devices adjacent the qubit device 500. The TSV 530 can substantially bound the trench capacitor 506, such as between opposite external surfaces 570 and 572 of the substrate layer 502. Thus, the substrate layer 502 can be separated into one or more portions, such as a first portion 502A inside (e.g., bounded by) the TSV 530 and a second portion 502B external to (e.g., not bounded by) of the TSV 530. As illustrated, a whole bounded length of the TSV 530 can connect the ground layers 520 and 522 to one another.

Figure 6:
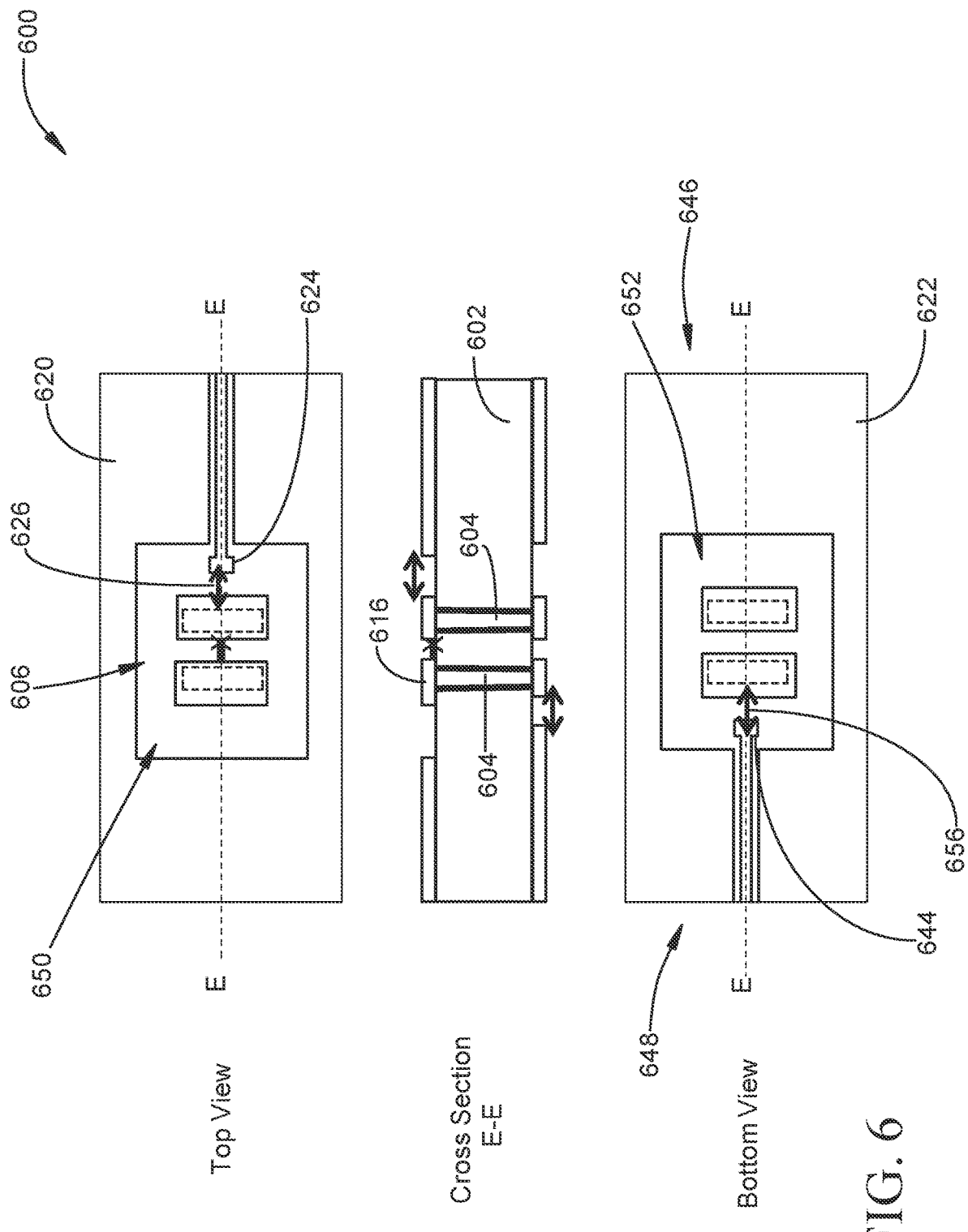
FIG. 6 illustrates a set of diagrams of various views of an additional device constructed in accordance with one or more embodiments described herein.

Looking next to FIG. 6, a device 600 is substantially similar to the device 300 of FIG. 3. Different from the device 300, the device 600 includes trenched sections 604 that extend fully through the substrate layer 602 between opposite surfaces 650 and 652 of the substrate layer 602. Accordingly, a pair of superconducting pads 616 are disposed adjacent the surface 650 and another pair of superconducting pads 616 are disposed adjacent the surface 652. That is, the trenches and thus the trenched sections 604 are enclosed at opposite ends within the substrate layer 602. This construction can allow for easy and/or efficient integration with one or more TSVs, such as including fewer processing steps as compared to trenches that do not extend fully through a substrate layer. Additionally and/or alternatively, coplanar coupling can be employed at either external surface side (e.g., re external surfaces 650 and/or 652). Further, each of the ground layers 620 and 622 circumscribes the trench capacitor 606 at the respective surfaces 650 and 652. Thus, the ground layers 620 and 622 can have respective shapes having portions omitted at locations of the trench capacitor 606 at the surfaces 650 and 652.

Also different from the device 300, the device 600 comprises a second resonator 644 disposed at a side of the substrate layer 602 that is opposite the resonator 624. Further, the resonators 624 and 644 extend from opposite ends 646 and 648, respectively, of the substrate layer 602. The ends 646 and 648 extend between the surfaces 650 and 652 of the substrate layer 602. A coupling 656 can be provided to couple the trench capacitor 606 to the resonator 644.

Figure 7:
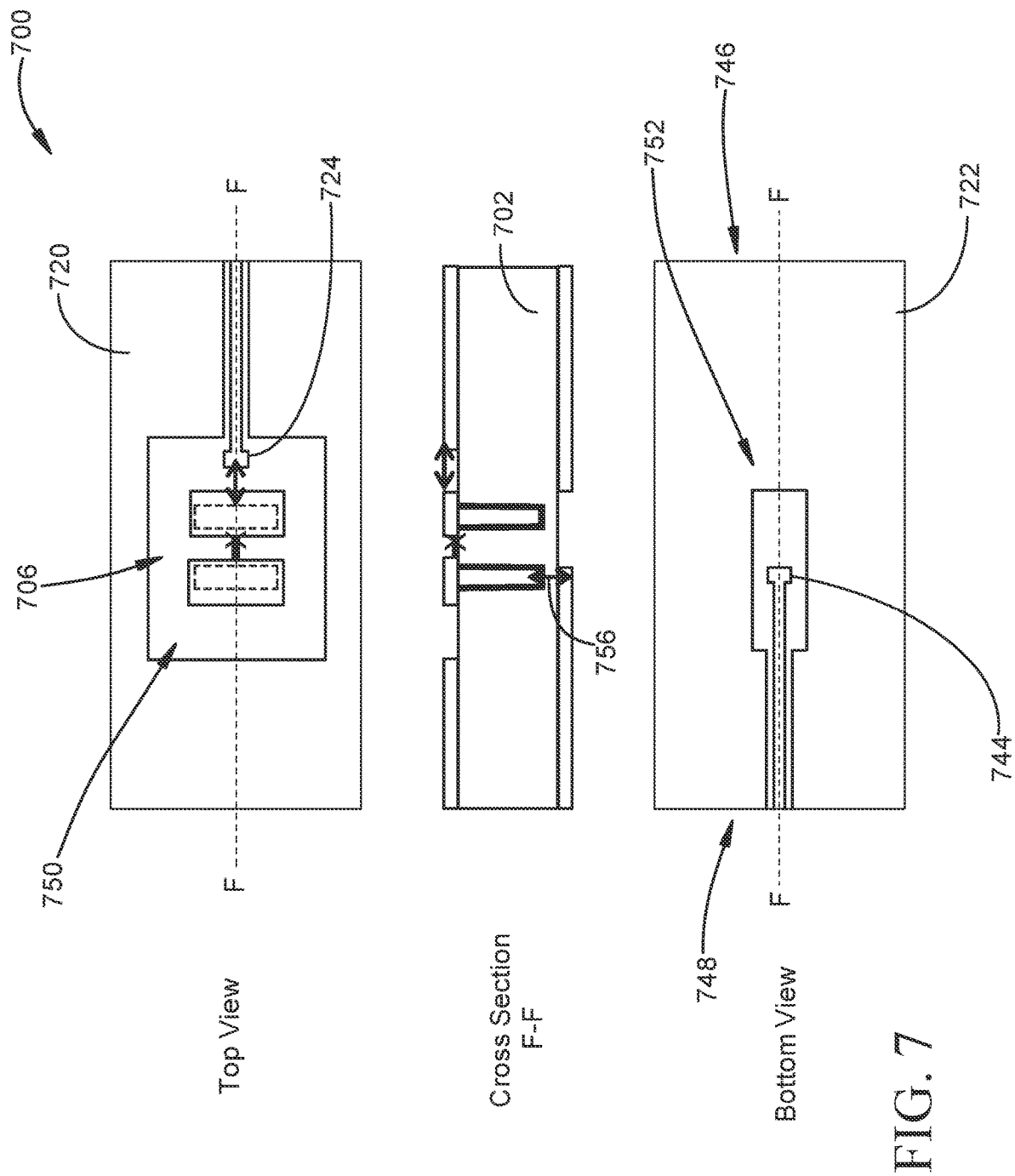
FIG. 7 illustrates a set of diagrams of various views of a further device constructed in accordance with one or more embodiments described herein.

Turning next to FIG. 7, a device 700 is substantially similar to the device 300 of FIG. 3. Different from the device 300, the device 700 comprises a second resonator 744 disposed at a side of the substrate layer 702 that is opposite the resonator 724. Further, the resonators 724 and 744 extend from opposite ends 746 and 748, respectively, of the substrate layer 702. The ground layer 722 surrounds but is spaced from the resonator 744 at the surface 752 of the substrate layer 702. The ends 746 and 748 extend between the surfaces 750 and 752 of the substrate layer 702. A coupling 756 can extend through the substrate layer 702, from the surface 752, to couple the trench capacitor 706 to the resonator 744.

Figure 8:
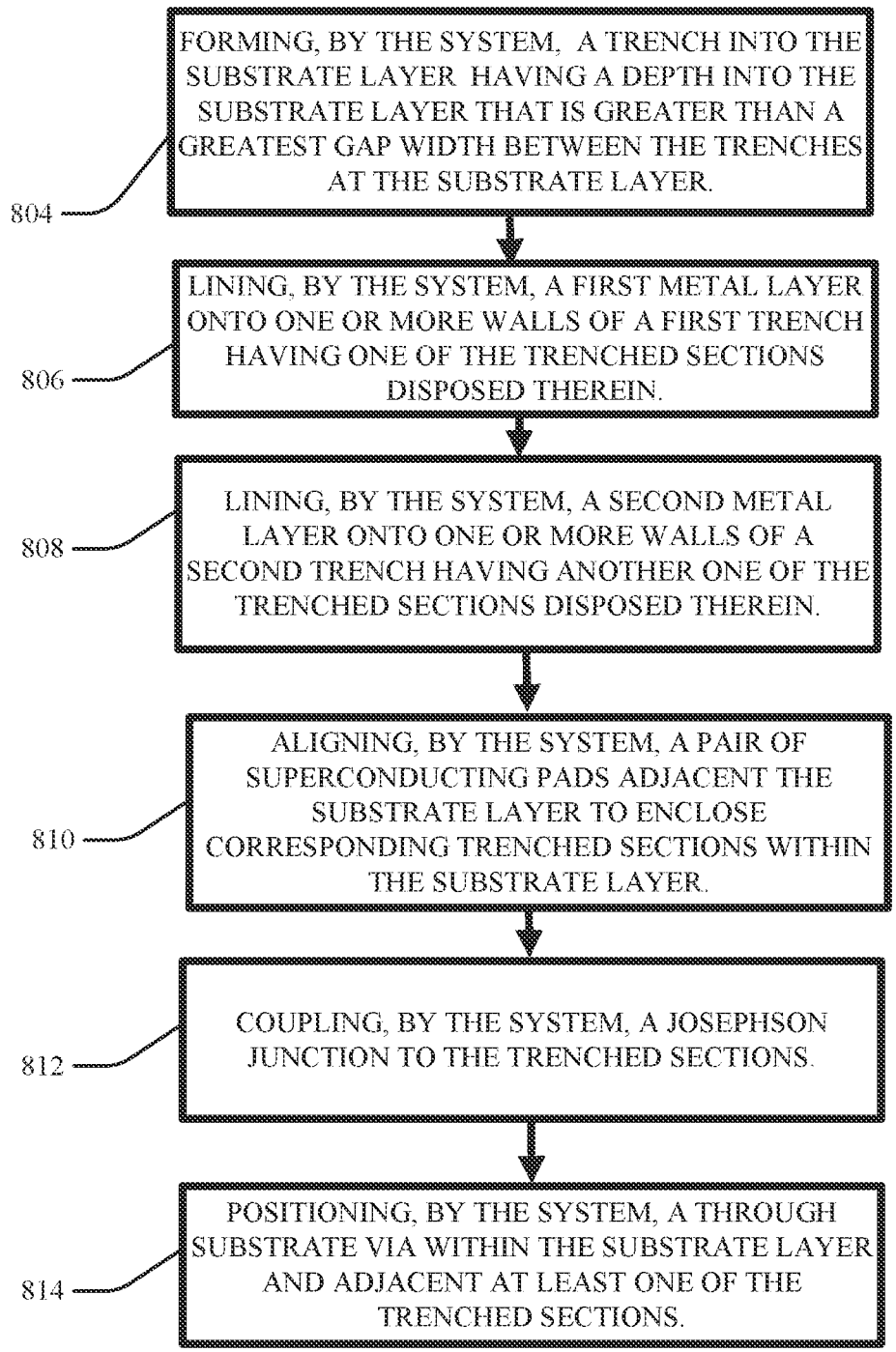
FIG. 8 illustrates a flow diagram of an example, non-limiting method that can facilitate a process to fabricate a device, in accordance with one or more embodiments described herein.

Next, FIG. 8 illustrates a flow diagram of an example, non-limiting method 800 that can facilitate a process to fabricate a device constructed in accordance with one or more embodiments described herein. While the method 800 is described relative to the device 200 of the non-limiting system 100, the method 800 can be applicable also other devices described herein, such as at FIGS. 2-7. Repetitive description of like elements and/or processes employed in respective embodiments is omitted for sake of brevity.

In one or more embodiments, these one or more operations can be performed by a manufacturing system, such as a manufacturing system comprising one or more manufacturing devices, where the manufacturing system is operatively coupled to a processor for at least partially controlling the one or more operations. For example, the below operations can be performed by the manufacturing system 150.

At 804, the method 800 can comprise forming, by the system (e.g., manufacturing system 150), a trench (e.g., trench 110) into the substrate layer having a depth (e.g., depth d) into the substrate layer that is greater than a greatest gap width (e.g., gap width g) between the trenches (e.g., trenches 110) at the substrate layer.

At 806, the method 800 can comprise lining, by the system (e.g., manufacturing system 150), a first metal layer (e.g., metal layer 112) onto one or more walls of a first trench having one of the trenched sections (e.g., trenched sections 104) disposed therein.

At 808, the method 800 can comprise lining, by the system (e.g., manufacturing system 150), a second metal layer (e.g., metal layer 112) onto one or more walls of a second trench having one of the trenched sections (e.g., trenched sections 104) disposed therein. In one or more embodiments, operations 806 and 808 can be performed together, such as being performed as a single operation.

At 810, the method 800 can comprise aligning, by the system (e.g., manufacturing system 150), a pair of superconducting pads (e.g., superconducting pads 116) adjacent the substrate layer (e.g., substrate layer 102) to enclose corresponding trenched sections (e.g., trenched sections 104) within the substrate layer (e.g., substrate layer 102).

At 812, the method 800 can comprise coupling, by the system (e.g., manufacturing system 150), a Josephson junction (e.g., Josephson junction 118) to the trenched sections (e.g., trenched sections 104).

At 814, the method 800 can comprise positioning, by the system (e.g., manufacturing system 150), a through substrate via within the substrate layer (e.g., substrate layer 102) and adjacent at least one of the trenched sections (e.g., trenched sections 104). In one or more embodiments, such substrate via can bound, such as majoratively bound, the trenched sections, such as between opposite external surfaces of the substrate layer.

For simplicity of explanation, the computer-implemented and non-computer-implemented methodologies provided herein are depicted and/or described as a series of acts. The subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. The computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

Figure 9:
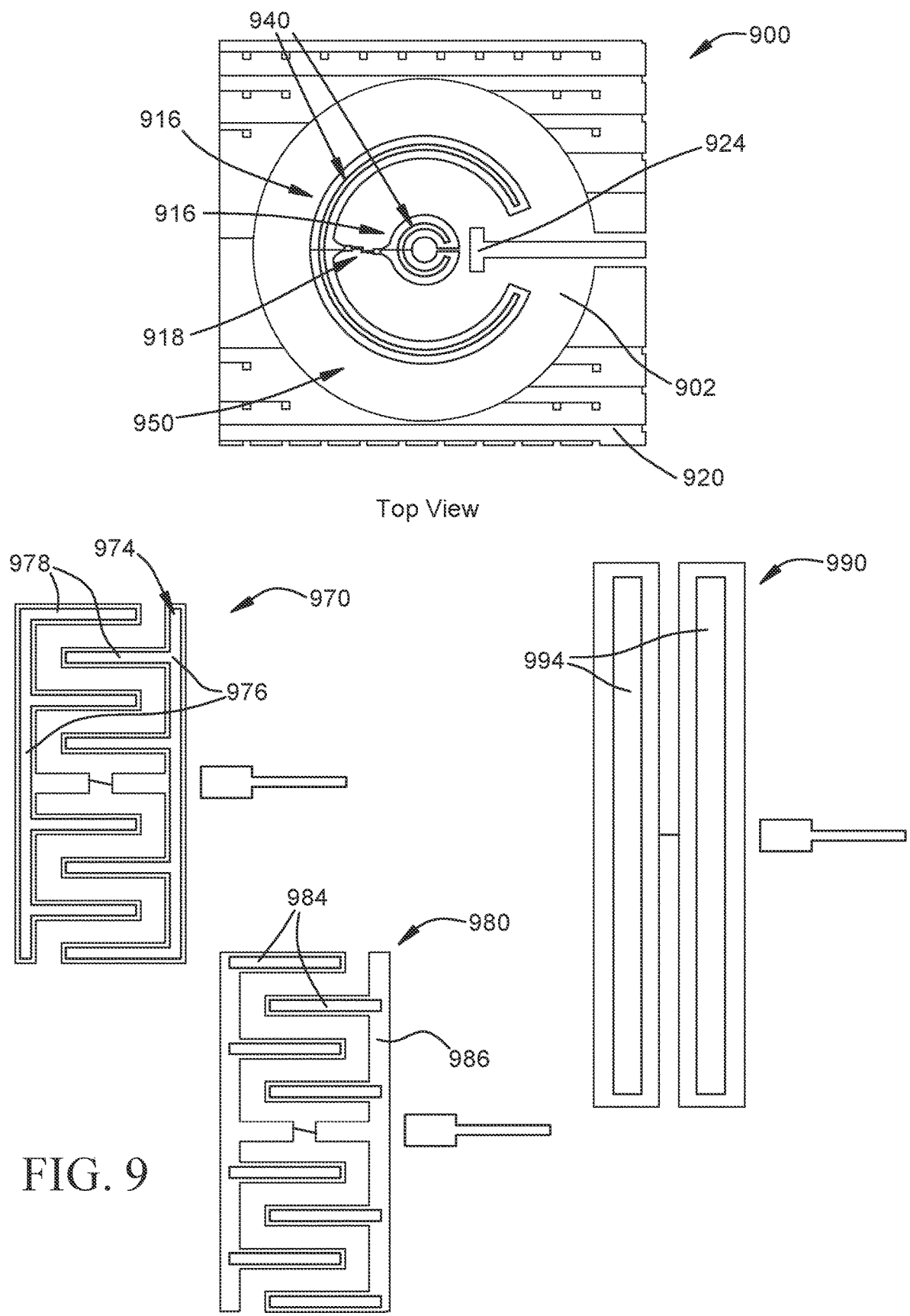
FIG. 9 illustrates various additional embodiments, in cross-section, of devices, in accordance with one or more embodiments described herein.

Referring now to FIG. 9, one or more additional embodiments of a superconducting device are illustrated. The various devices can be employed to facilitate operating a qubit having minimal electric field energy coupling at surface layers of the superconducting device and/or that can have a small footprint. One or more functions, structures, dimensions and/or features of the various devices 900, 970, 980 and 990 illustrated at FIG. 9 likewise can be employed relative to any one or more of the aforementioned devices, such as at the device 100, and/or vice versa. Repetitive description of like elements and/or processes employed in respective embodiments is omitted for sake of brevity.

At FIG. 9, superconducting device 900 comprises a pair of trenched sections 940. Both trenched sections 940 have cylindrical shapes, and an inner trenched section 940 is disposed bounded by an outer trenched section 940. That is, the inner trenched section 940 is substantially, such as majoratively, bounded by the outer trenched section 940, such as between opposite external surfaces of the device 900. A resonator 924 is disposed at least partially through the substrate layer 902. A ground layer 920 is disposed at a first external surface 950 of the substrate layer 902. A Josephson junction 918 is coupled to the trenched sections 940, such as being disposed between the trenched sections 940. Separate superconducting pads 916, such as caps, can be disposed over the trenched sections 940, such as enclosing the trenched sections 940. At the top view of the device at FIG. 9, the trenched sections 940 can be viewed through the superconducting pads 916 for ease of illustration.

Also at FIG. 9, superconducting devices 970, 980 and 990 are illustrated. Device 970 includes interdigitated and enclosed trenched sections 974. First portions 976 are aligned parallel to one another and extend along a first direction. Second portions 978 also are aligned parallel to one another and extend along a second direction that is transverse to the first direction. The second portions 978 extend from the first portions 976. The first and second directions extend generally orthogonal to one another. Device 980 includes offset and parallelly arranged trenched sections 984. A shape of superconducting pads 986 enclosing the trenched sections 984 can be interdigitated. Device 990 includes trenched sections 994 having increased length at an external surface of a respective substrate layer. Such increased length can extend into and/or through the respective substrate layer.

In summary, one or more systems, devices, methods of use and/or methods of fabrication provided herein relate to a superconducting device that can be operated with minimal electric field energy coupling at surface layers of the superconducting device and/or that can have a small footprint. According to one embodiment, a device can comprise a Josephson junction located between a first capacitor portion and a second capacitor portion of a capacitor, wherein at least a trenched section of the first capacitor portion is located beneath a surface of a substrate, and wherein at least a trenched section of the second capacitor portion is located beneath the surface of the substrate. According to another embodiment, a device can comprise a capacitor disposed within a substrate layer and the capacitor comprising a pair of material-filled trenches in the substrate layer, and a Josephson junction coupled to the capacitor. An advantage of such device can be a superconducting device that has a reduced overall size. The reduced overall size of the device can allow for increased quantity of such devices to be employed relative to a common overall footprint, such as within a cryogenic chamber. This reduced size can make up for one or more deficiencies of existing technologies that can look to increase size of capacitors to reduce substrate to air participation effect and/or qubit decoherence.

Another advantage of such device can be employment of a superconducting device that can operate while producing a small electric field, such as a small peak electric field at the substrate surface, as compared to existing technologies. The electric field can be majoratively directed and confined to a substrate layer of the device, such as to a bulk of the substrate layer with minimal and/or no confinement to an external surface(s) of the substrate layer. That is, by employing parallel alignment of the paired metallic portions of the capacitor, combined with enclosing within the substrate layer, one or more of these advantages can be realized. Indeed, as a result of one or more of these advantages, operation of the device in a quantum system can lead to reduced noise and/or improved coherence of one or more qubits.

An advantage of material fill can be structural support of the superconducting pad enclosing the respective trench. An advantage of employing trenches can be fabrication of such device employing patterning approaches, such as photoligthography, relative to one or more surfaces of a substrate having minimal topography.

Yet another advantage of such device can be reduced maintenance of superconducting devices of an associated quantum system. That is, due to reduced substrate to air participation effect, cleaning of surfaces of the device to eliminate silicon oxide build up can be reduced.

In view of the one or more embodiments described herein, a practical application of the devices described herein is reduction in qubit circuit noise and/or increase in qubit coherency. This is a useful and practical application of computers, especially in view reduction of noise and/or other effects on reducing decoherence of employed qubits, and thus facilitating enhanced (e.g., improved and/or optimized) operation of the employed qubits. These enhancements can include increased accuracy of quantum results and/or increased availability of the employed qubits. Overall, such computerized tools can constitute a concrete and tangible technical improvement in the field of quantum computing.

Furthermore, one or more embodiments described herein can be employed in a real-world system based on the disclosed teachings. For example, one or more embodiments described herein can function within a system that can receive as input a quantum job request and can generate as a real-world physical pulse operated on one or more qubits of a quantum system. The one or more physical qubit devices can comprise a device according to the one or more embodiments described herein. The respective quantum system can generate one or more quantum results in response to the performance of the one or more physical operations on the real-world qubits of the quantum system.

Moreover, a device and/or method described herein can be implemented in one or more domains to enable scaled quantum program executions. Indeed, use of a device as described herein can be scalable, such as where plural such devices are coupled to one another within a cryogenic chamber, and further coupled to a controlling quantum control system.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein are inherently and/or inextricably tied to computer technology and cannot be implemented outside of a computing environment. For example, one or more processes performed by one or more embodiments described herein can more efficiently, and even more feasibly, provide program and/or program instruction execution as compared to existing systems and/or techniques. Systems, computer-implemented methods and/or computer program products facilitating performance of these processes are of great utility in the field of non-monolithic architectures, such as cloud native and/or microservice architectures and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively execute one or more quantum programs in the time that one or more embodiments described herein can facilitate this process. And, neither can the human mind nor a human with pen and paper electronically execute quantum programs as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 10:
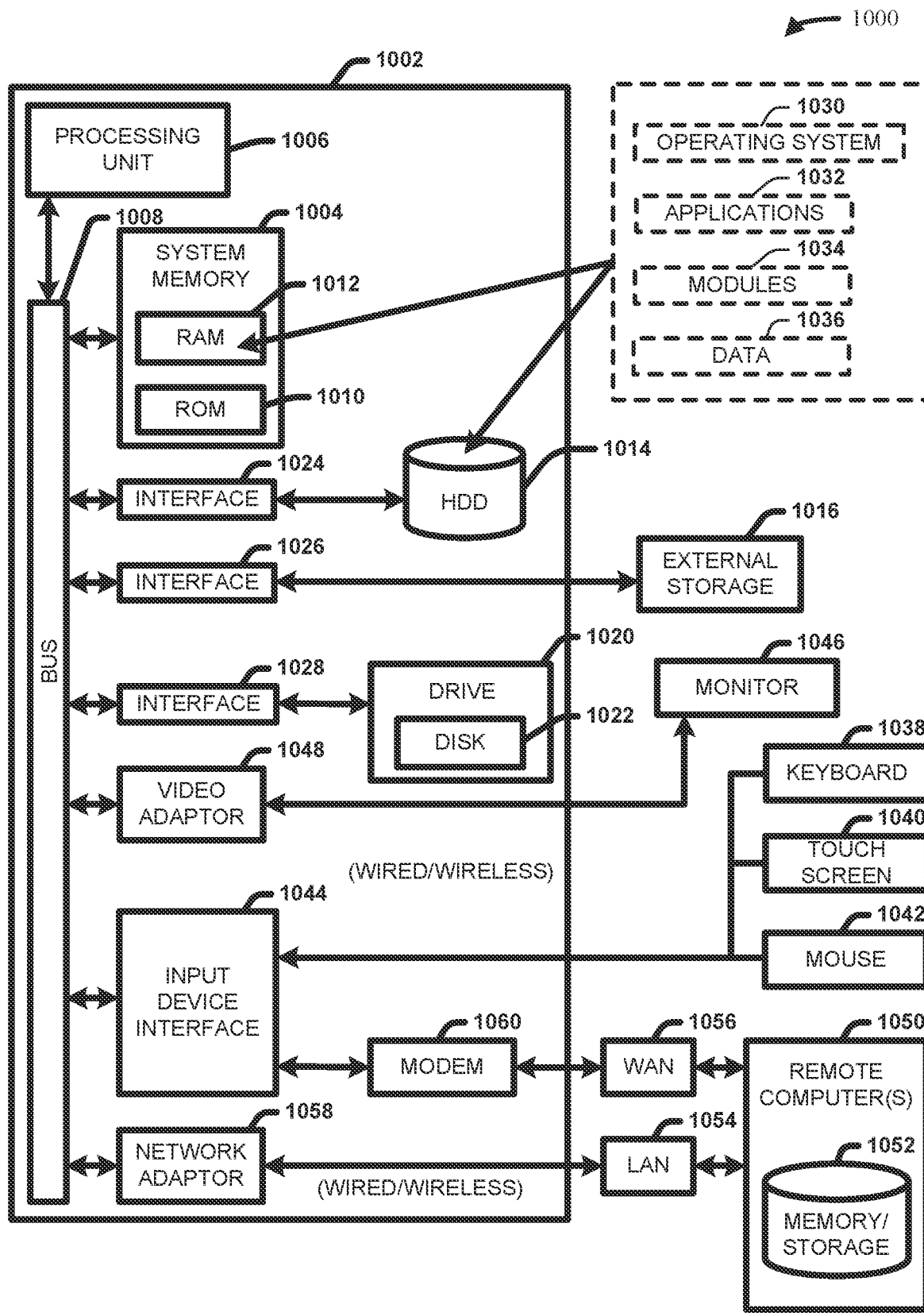
FIG. 10 illustrates a block diagram of an example, non-limiting operating environment in which one or more embodiments described herein can be facilitated.
Figure 11:
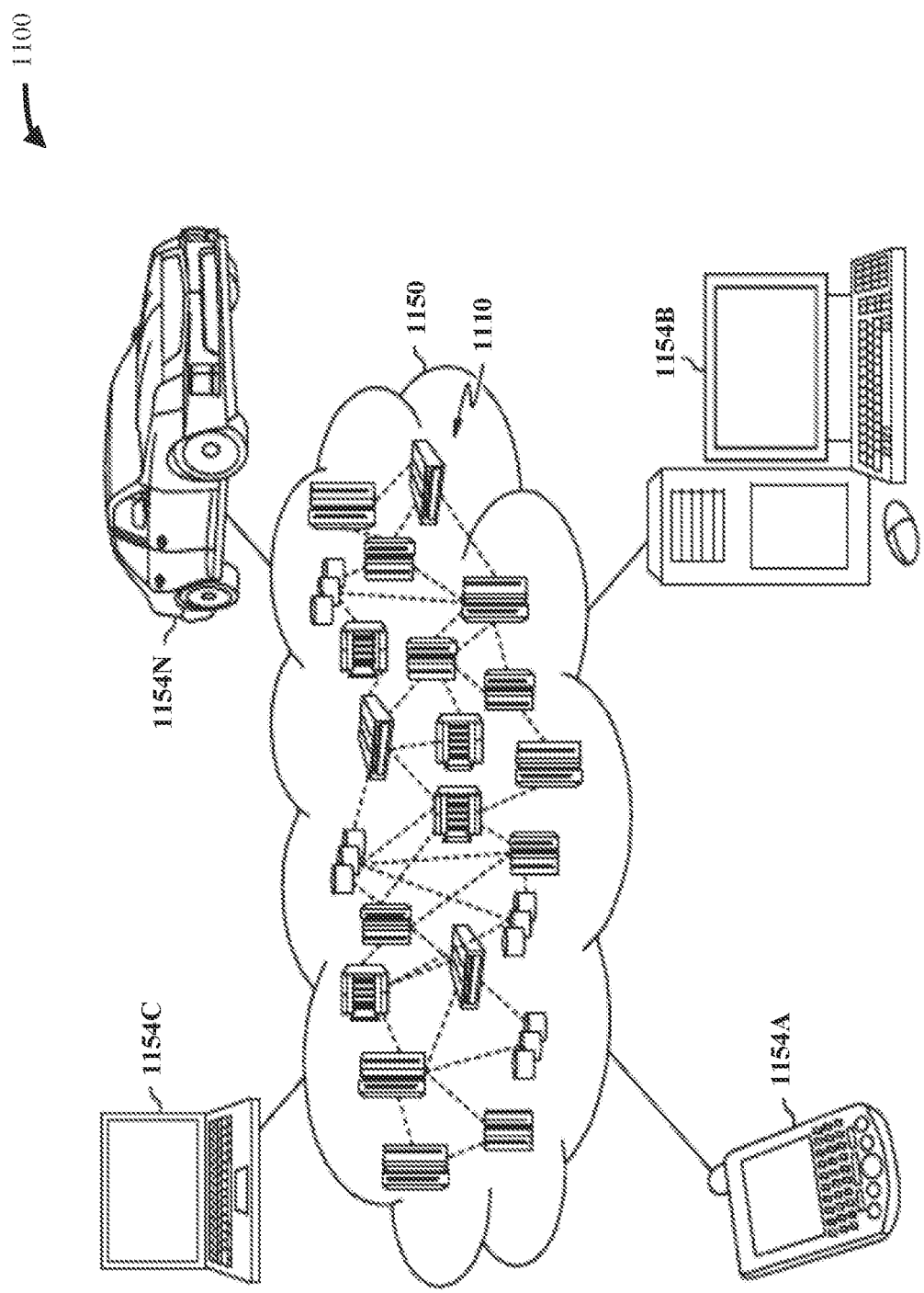
FIG. 11 illustrates a block diagram of an example, non-limiting cloud computing environment in accordance with one or more embodiments described herein.
Figure 12:
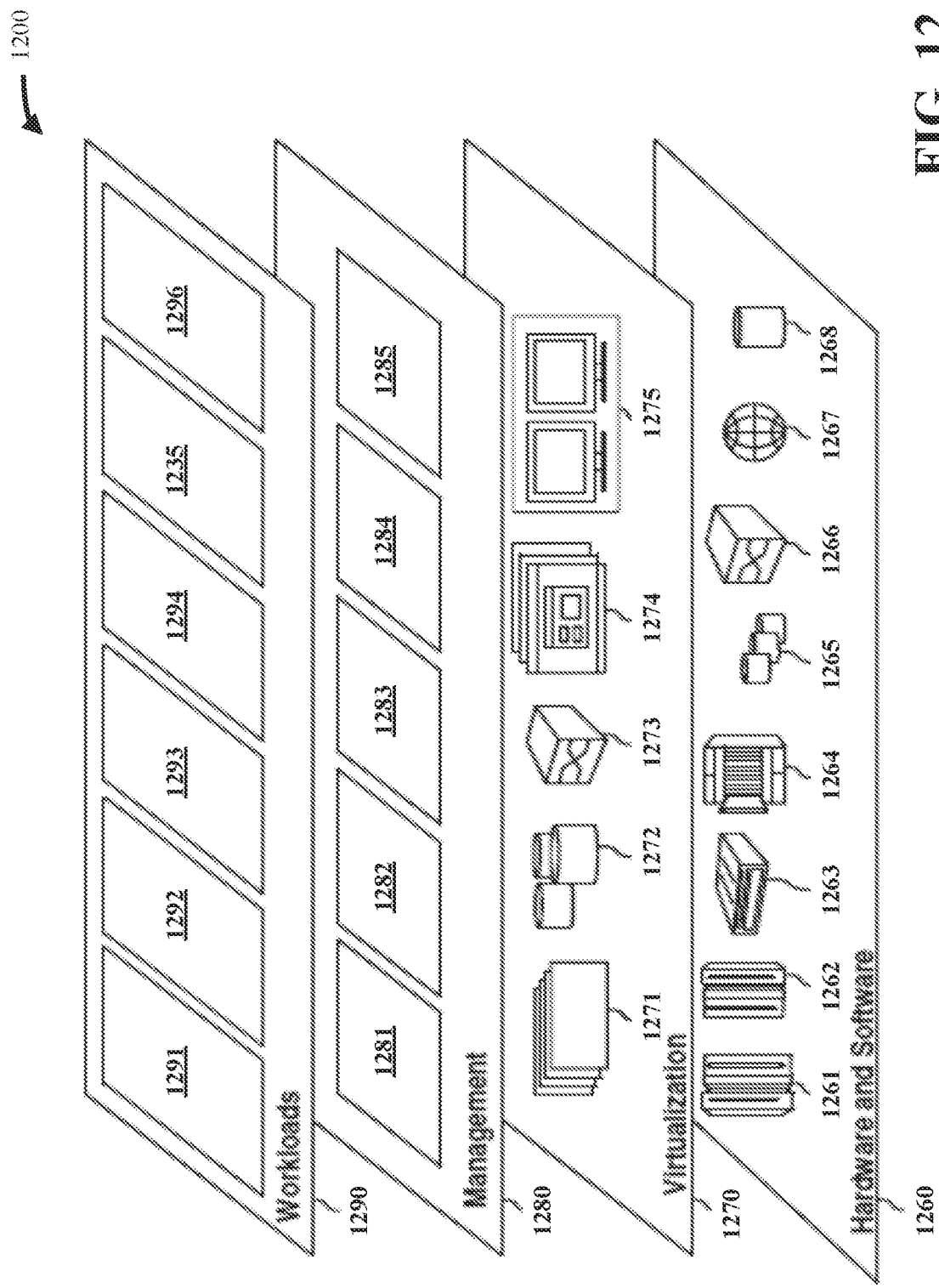
FIG. 12 illustrates a block diagram of a plurality of example, non-limiting abstraction model layers, in accordance with one or more embodiments described herein.

Turning next to FIGS. 10-12, a detailed description is provided of additional context for the one or more embodiments described herein at FIGS. 1-9.

FIG. 10 and the following discussion are intended to provide a brief, general description of a suitable operating environment 1000 in which one or more embodiments described herein at FIGS. 1-9 can be implemented. For example, one or more components and/or other aspects of embodiments described herein can be implemented in or be associated with, such as accessible via, the operating environment 1000. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 10, the example operating environment 1000 for implementing one or more embodiments of the aspects described herein can include a computer 1002, the computer 1002 including a processing unit 1006, a system memory 1004 and/or a system bus 1008. One or more aspects of the processing unit 1006 can be applied to processors such as 106 of the non-limiting system 100.

The processing unit 1006 can be implemented in combination with and/or alternatively to processors such as 106.

Memory 1004 can store one or more computer and/or machine readable, writable and/or executable components and/or instructions that, when executed by processing unit 1006 (e.g., a classical processor, a quantum processor and/or like processor), can facilitate performance of operations defined by the executable component(s) and/or instruction(s). For example, memory 1004 can store computer and/or machine readable, writable and/or executable components and/or instructions that, when executed by processing unit 1006, can facilitate execution of the one or more functions described herein relating to non-limiting system 100, as described herein with or without reference to the one or more figures of the one or more embodiments.

Memory 1004 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 1006 can comprise one or more types of processors and/or electronic circuitry (e.g., a classical processor, a quantum processor and/or like processor) that can implement one or more computer and/or machine readable, writable and/or executable components and/or instructions that can be stored at memory 1004. For example, processing unit 1006 can perform one or more operations that can be specified by computer and/or machine readable, writable and/or executable components and/or instructions including, but not limited to, logic, control, input/output (I/O), arithmetic and/or the like. In one or more embodiments, processing unit 1006 can be any of one or more commercially available processors. In one or more embodiments, processing unit 1006 can comprise one or more central processing unit, multi-core processor, microprocessor, dual microprocessors, microcontroller, System on a Chip (SOC), array processor, vector processor, quantum processor and/or another type of processor. The examples of processing unit 1006 can be employed to implement one or more embodiments described herein.

The system bus 1008 can couple system components including, but not limited to, the system memory 1004 to the processing unit 1006. The system bus 1008 can comprise one or more types of bus structure that can further interconnect to a memory bus (with or without a memory controller), a peripheral bus and/or a local bus using one or more of a variety of commercially available bus architectures. The system memory 1004 can include ROM 1010 and/or RAM 1012. A basic input/output system (BIOS) can be stored in a non-volatile memory such as ROM, erasable programmable read only memory (EPROM) and/or EEPROM, which BIOS contains the basic routines that help to transfer information among elements within the computer 1002, such as during startup. The RAM 1012 can include a high-speed RAM, such as static RAM for caching data.

The computer 1002 can include an internal hard disk drive (HDD) 1014 (e.g., EIDE, SATA), one or more external storage devices 1016 (e.g., a magnetic floppy disk drive (FDD), a memory stick or flash drive reader, a memory card reader and/or the like) and/or a drive 1020, e.g., such as a solid state drive or an optical disk drive, which can read or write from a disk 1022, such as a CD-ROM disc, a DVD, a BD and/or the like. Additionally, and/or alternatively, where a solid state drive is involved, disk 1022 could not be included, unless separate. While the internal HDD 1014 is illustrated as located within the computer 1002, the internal HDD 1014 can also be configured for external use in a suitable chassis (not shown). Additionally, while not shown in operating environment 1000, a solid state drive (SSD) can be used in addition to, or in place of, an HDD 1014. The HDD 1014, external storage device(s) 1016 and drive 1020 can be connected to the system bus 1008 by an HDD interface 1024, an external storage interface 1026 and a drive interface 1028, respectively. The HDD interface 1024 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1002, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 1012, including an operating system 1030, one or more applications 1032, other program modules 1034 and/or program data 1036. All or portions of the operating system, applications, modules and/or data can also be cached in the RAM 1012. The systems and/or methods described herein can be implemented utilizing one or more commercially available operating systems and/or combinations of operating systems.

Computer 1002 can optionally comprise emulation technologies. For example, a hypervisor (not shown) or other intermediary can emulate a hardware environment for operating system 1030, and the emulated hardware can optionally be different from the hardware illustrated in FIG. 10. In a related embodiment, operating system 1030 can comprise one virtual machine (VM) of multiple VMs hosted at computer 1002. Furthermore, operating system 1030 can provide runtime environments, such as the JAVA runtime environment or the .NET framework, for applications 1032. Runtime environments are consistent execution environments that can allow applications 1032 to run on any operating system that includes the runtime environment. Similarly, operating system 1030 can support containers, and applications 1032 can be in the form of containers, which are lightweight, standalone, executable packages of software that include, e.g., code, runtime, system tools, system libraries and/or settings for an application.

Further, computer 1002 can be enabled with a security module, such as a trusted processing module (TPM). For instance, with a TPM, boot components hash next in time boot components and wait for a match of results to secured values before loading a next boot component. This process can take place at any layer in the code execution stack of computer 1002, e.g., applied at application execution level and/or at operating system (OS) kernel level, thereby enabling security at any level of code execution.

An entity can enter and/or transmit commands and/or information into the computer 1002 through one or more wired/wireless input devices, e.g., a keyboard 1038, a touch screen 1040 and/or a pointing device, such as a mouse 1042.

Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be connected to the processing unit 1006 through an input device interface 1044 that can be coupled to the system bus 1008, but can be connected by other interfaces, such as a parallel port, an IEEE 1394 serial port, a game port, a USB port, an IR interface, a BLUETOOTH® interface and/or the like.

A monitor 1046 or other type of display device can be alternatively and/or additionally connected to the system bus 1008 via an interface, such as a video adapter 1048. In addition to the monitor 1046, a computer typically includes other peripheral output devices (not shown), such as speakers, printers and/or the like.

The computer 1002 can operate in a networked environment using logical connections via wired and/or wireless communications to one or more remote computers, such as a remote computer(s) 1050. The remote computer(s) 1050 can be a workstation, a server computer, a router, a personal computer, portable computer, microprocessor-based entertainment appliance, a peer device and/or other common network node, and typically includes many or all of the elements described relative to the computer 1002, although, for purposes of brevity, only a memory/storage device 1052 is illustrated. Additionally, and/or alternatively, the computer 1002 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 1054 and/or larger networks, e.g., a wide area network (WAN) 1056. LAN and WAN networking environments can be commonplace in offices and companies and can facilitate enterprise-wide computer networks, such as intranets, all of which can connect to a global communications network, e.g., the Internet.

When used in a LAN networking environment, the computer 1002 can be connected to the local network 1054 through a wired and/or wireless communication network interface or adapter 1058. The adapter 1058 can facilitate wired and/or wireless communication to the LAN 1054, which can also include a wireless access point (AP) disposed thereon for communicating with the adapter 1058 in a wireless mode.

When used in a WAN networking environment, the computer 1002 can include a modem 1060 and/or can be connected to a communications server on the WAN 1056 via other means for establishing communications over the WAN 1056, such as by way of the Internet. The modem 1060, which can be internal and/or external and a wired and/or wireless device, can be connected to the system bus 1008 via the input device interface 1044. In a networked environment, program modules depicted relative to the computer 1002 or portions thereof can be stored in the remote memory/storage device 1052. The network connections shown are merely exemplary and one or more other means of establishing a communications link among the computers can be used.

When used in either a LAN or WAN networking environment, the computer 1002 can access cloud storage systems or other network-based storage systems in addition to, and/or in place of, external storage devices 1016 as described above, such as but not limited to, a network virtual machine providing one or more aspects of storage and/or processing of information. Generally, a connection between the computer 1002 and a cloud storage system can be established over a LAN 1054 or WAN 1056 e.g., by the adapter 1058 or modem 1060, respectively. Upon connecting the computer 1002 to an associated cloud storage system, the external storage interface 1026 can, such as with the aid of the adapter 1058 and/or modem 1060, manage storage provided by the cloud storage system as it would other types of external storage. For instance, the external storage interface 1026 can be configured to provide access to cloud storage sources as if those sources were physically connected to the computer 1002.

The computer 1002 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 11, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 1150 described below with reference to FIG. 11, and/or with reference to the one or more functional abstraction layers (e.g., quantum software and/or the like) described below with reference to FIG. 12, to execute one or more operations in accordance with one or more embodiments described herein. For example, cloud computing environment 1150 and/or one or more of the functional abstraction layers 1260, 1270, 1280 and/or 1290 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/ or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as Follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 1000 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 1000 can be employed to use hardware and/or software to solve problems that are highly technical in nature, that are not abstract and/or that cannot be performed as a set of mental acts by a human.

Referring now to details of one or more aspects illustrated at FIG. 11, the illustrative cloud computing environment 1150 is depicted. As shown, cloud computing environment 1150 includes one or more cloud computing nodes 1110 with which local computing devices used by cloud consumers, such as, for example, personal digital assistant (PDA) or cellular telephone 1154A, desktop computer 1154B, laptop computer 1154C and/or automobile computer system 1154N can communicate. Although not illustrated in FIG. 11, cloud computing nodes 1110 can further comprise a quantum platform (e.g., quantum computer, quantum hardware, quantum software and/or the like) with which local computing devices used by cloud consumers can communicate. Cloud computing nodes 1110 can communicate with one another. They can be grouped (not shown) physically or virtually, in one or more networks, such as Private, Community, Public, or Hybrid clouds as described hereinabove, or a combination thereof. This allows cloud computing environment 1150 to offer infrastructure, platforms and/or software as services for which a cloud consumer does not need to maintain resources on a local computing device. It is understood that the types of computing devices 1154A-N shown in FIG. 11 are intended to be illustrative only and that cloud computing nodes 1110 and cloud computing environment 1150 can communicate with any type of computerized device over any type of network and/or network addressable connection (e.g., using a web browser).

Referring now to details of one or more aspects illustrated at FIG. 12, a set 1200 of functional abstraction layers is shown, such as provided by cloud computing environment 1150 (FIG. 11). One or more embodiments described herein can be associated with, such as accessible via, one or more functional abstraction layers described below with reference to FIG. 12 (e.g., hardware and software layer 1260, virtualization layer 1270, management layer 1280 and/or workloads layer 1290). It should be understood in advance that the components, layers and/or functions shown in FIG. 12 are intended to be illustrative only and embodiments described herein are not limited thereto. As depicted, the following layers and/or corresponding functions are provided:

Hardware and software layer 1260 can include hardware and software components. Examples of hardware components include: mainframes 1261; RISC (Reduced Instruction Set Computer) architecture-based servers 1262; servers 1263; blade servers 1264; storage devices 1265; and/or networks and/or networking components 1266. In one or more embodiments, software components can include network application server software 1267, quantum platform routing software 1268; and/or quantum software (not illustrated in FIG. 12).

Virtualization layer 1270 can provide an abstraction layer from which the following examples of virtual entities can be provided: virtual servers 1271; virtual storage 1272; virtual networks 1273, including virtual private networks; virtual applications and/or operating systems 1274; and/or virtual clients 1275.

In one example, management layer 1280 can provide the functions described below. Resource provisioning 1281 can provide dynamic procurement of computing resources and other resources that can be utilized to perform tasks within the cloud computing environment. Metering and Pricing 1282 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1283 can provide access to the cloud computing environment for consumers and system administrators. Service level management 1284 can provide cloud computing resource allocation and/or management such that required service levels are met. Service Level Agreement (SLA) planning and fulfillment 1285 can provide pre-arrangement for, and procurement of, cloud computing resources for which a future requirement is anticipated in accordance with an SLA.

Workloads layer 1290 can provide examples of functionality for which the cloud computing environment can be utilized. Non-limiting examples of workloads and functions which can be provided from this layer include: mapping and navigation 1291; software development and lifecycle management 1292; virtual classroom education delivery 1293; data analytics processing 1294; transaction processing 1295; and/or application transformation software 1296.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," "data storage," "database," and substantially any other information storage component relevant to operation and functionality of a component are utilized to refer to "memory components," entities embodied in a "memory," or components comprising a memory. memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

The claims and scope of the subject application, and any continuation, divisional or continuation-in-part applications claiming priority to the subject application, exclude embodiments (e.g., systems, apparatus, methodologies, computer program products and computer readable storage media) directed to implanted electrical stimulation for pain treatment and/or management.

What is claimed is:

1. A device, comprising:
a Josephson junction located between a first capacitor portion and a second capacitor portion of a capacitor, wherein the first capacitor portion is separated from the second capacitor portion,
wherein the first capacitor portion comprises a first trenched section that is located beneath a surface of a substrate,
wherein the second capacitor portion comprises a second trenched section that is located beneath the surface of the substrate,
wherein the first trenched section and the second trenched section comprise respective trenches having respective surfaces completely lined with a first superconducting material,
where the respective trenches are filled with a fill material that is not superconducting, and
wherein the respective trenches are completely enclosed at the surface of the substrate with respective superconducting pads comprising a second superconducting material.

2. The device of claim 1,
wherein the second superconducting material is different from the first superconducting material.

3. The device of claim 1,
wherein the second superconducting material is a same material as the first superconducting material.

4. The device of claim 1, wherein at least one of:
a first depth into the substrate of the trench of the first trench section is greater than a greatest width of the first trenched section the surface of the substrate, or
a second depth into the substrate of the trench of the second trench section is greater than a greatest width of the second trenched section the surface of the substrate.

5. The device of claim 1, wherein the fill material is a liquid material.

6. The device of claim 1, wherein at least one of a first depth into the substrate of the trench of the first trenched section or a second depth into the substrate of the trench of the second trench section is greater than a greatest width of a gap between the first trenched section and the second trench section.

7. The device of claim 1, further comprising:
a through-substrate via located within the substrate and located adjacent to at least one of the first trenched section or the second trench section.

8. The device of claim 1, wherein the fill material is an insulator material.

9. A method, comprising:
forming, by a system operatively coupled to a processor, a capacitor in a substrate, wherein the forming comprises:
forming a first capacitor portion of the capacitor comprising a first trenched section that is located beneath the surface of the substrate, and
forming a second capacitor portion of the capacitor comprising a second trenched section that is located beneath the surface of the substrate, wherein the first capacitor portion is separated from the second capacitor portion,
wherein the first trenched section and the second trenched section comprise respective trenches having respective surfaces completely lined with a first superconducting material,
where the respective trenches are filled with a fill material that is not superconducting, and
wherein the respective trenches are completely enclosed at the surface of the substrate with respective superconducting pads comprising a second superconducting material; and
forming, by the system, a Josephson junction between the first capacitor portion and the second capacitor portion.

10. The method of claim 9, wherein the second superconducting material is different from the first superconducting material.

11. The method of claim 9, wherein the second superconducting material is a same material as the first superconducting material.

12. The method of claim 10, further comprising at least one of:
forming the first trenched section comprising a first depth into the substrate of the trench of the first trenched section that is greater than a greatest width of the first trenched section the surface of the substrate, or
forming the second trenched section comprising a second depth into the substrate of the trench of the second trenched section that is greater than a greatest width of the second trenched section the surface of the substrate.

13. The method of claim 9, further comprising at least one of:
forming the first trenched section comprising a first depth into the substrate of the trench of the first trenched section that is greater than a greatest width of the separation between the first trenched section and the second trench section, or
forming the second trenched section comprising a second depth into the substrate of the trench of the second trenched section that is greater than the greatest width of the separation between the first trenched section and the second trench section.

14. The method of claim 9, further comprising:
forming, by the system, a through-substrate via within the substrate.

15. A qubit device, comprising:
a trench capacitor comprising a first capacitor portion and a second capacitor portion,
wherein the first capacitor portion is separated from the second capacitor portion,
wherein the first capacitor portion comprises a first trenched section that is located beneath a surface of a substrate,
wherein the second capacitor portion comprises a second trenched section that is located beneath the surface of the substrate, and
wherein the first trenched section and the second trenched section comprise respective trenches having respective surfaces completely lined with a first superconducting material,
where the respective trenches are filled with a fill material that is not superconducting, and
wherein the respective trenches are completely enclosed at the surface of the substrate with respective superconducting pads comprising a second superconducting material; and
a Josephson junction coupled to the trench capacitor.

16. The qubit device of claim 15, wherein the second superconducting material is different from the first superconducting material.

17. The qubit device of claim 15, wherein the second superconducting material is a same material as the first superconducting material.

18. The qubit device of claim 15, wherein at least one of:
a first depth into the substrate of the trench of the first trenched section is greater than a greatest width of the first trenched section the surface of the substrate, or
a second depth into the substrate of the trench of the second trench section is greater than a greatest width of the second trenched section the surface of the substrate.

19. The qubit device of claim 15, wherein at least one of a first depth into the substrate of the trench of the first trenched section or a second depth into the substrate of the trench of the second trench section is greater than a greatest width of a gap between the first trenched section and the second trench section.

20. The qubit device of claim 15, wherein the fill material is a liquid material.

21. The qubit device of claim 15, further comprising:
a resonator located adjacent one of the trenches.

22. A quantum circuit, comprising:
a capacitor disposed within a substrate, wherein the capacitor comprises a first capacitor portion and a second capacitor portion,
wherein the first capacitor portion is separated from the second capacitor portion,
wherein the first capacitor portion comprises a first trenched section that is located beneath the surface of a substrate,
wherein the second capacitor portion comprises a second trenched section that is located beneath the surface of the substrate, and
wherein the first trenched section and the second trenched section comprise respective trenches having respective surfaces completely lined with a first superconducting material,
where the respective trenches are filled with a fill material that is not superconducting, and
wherein the respective trenches are completely enclosed at the surface of the substrate with respective superconducting pads comprising a second superconducting; and
a Josephson junction coupled to the capacitor.

23. The quantum circuit of claim 22, further comprising:
a resonator located adjacent one of the trenches; and
a through-substrate via extending at least partially through the substrate layer.

24. A method, comprising:
exciting, by a system operatively coupled to a processor, a trench capacitor comprising a first capacitor portion and a second capacitor portion,
wherein the first capacitor portion is separated from the second capacitor portion,
wherein the first capacitor portion comprises a first trenched section that is located beneath a surface of a substrate,
wherein the second capacitor portion comprises a second trenched section that is located beneath the surface of the substrate, and
wherein the first trenched section and the second trenched section comprise respective trenches having respective surfaces completely lined with a first superconducting material,
where the respective trenches are filled with a fill material that is not superconducting, and
wherein the respective trenches are completely enclosed at the surface of the substrate with respective superconducting pads comprising a second superconducting; and
concurrently exciting, by the system, a Josephson junction coupled to the trench capacitor.

25. The method of claim 24, further comprising:
varying, by the system, the excitation of the trench capacitor.

* * * * *